United States Patent
Skutt et al.

(10) Patent No.: US 11,958,372 B2
(45) Date of Patent: Apr. 16, 2024

(54) DEVICE FOR BI-DIRECTIONAL POWER CONVERSION AND CHARGING FOR USE WITH ELECTRIC VEHICLES

(71) Applicant: FERMATA ENERGY LLC, Wilmington, DE (US)

(72) Inventors: Glenn Skutt, Charlottesville, VA (US); Brian Maddox, Charlottesville, VA (US); Mike Barron, Charlottesville, VA (US)

(73) Assignee: Fermata Energy LLC, Charlottesville, VA (US)

( * ) Notice: Subject to any disclaimer, the term of this patent is extended or adjusted under 35 U.S.C. 154(b) by 458 days.

(21) Appl. No.: 17/102,284

(22) Filed: Nov. 23, 2020

(65) Prior Publication Data

US 2021/0155104 A1    May 27, 2021

Related U.S. Application Data

(60) Provisional application No. 62/940,713, filed on Nov. 26, 2019, provisional application No. 62/940,680, (Continued)

(51) Int. Cl.
*H02J 7/00* (2006.01)
*B60L 53/12* (2019.01)
(Continued)

(52) U.S. Cl.
CPC ............. *B60L 53/24* (2019.02); *B60L 53/12* (2019.02); *B60L 53/302* (2019.02); *B60L 53/50* (2019.02);
(Continued)

(58) Field of Classification Search
CPC .......... B60L 53/24; B60L 53/12; B60L 53/60; B60L 53/302; H02J 7/0042; H02J 7/04
(Continued)

(56) References Cited

U.S. PATENT DOCUMENTS 7,274,975 B2    9/2007 Miller
7,590,472 B2    9/2009 Hakim et al.
(Continued)

FOREIGN PATENT DOCUMENTS

| CN | 109546855 A | 3/2019 |
|---|---|---|
| DE | 11 2017 005 524 T5 | 7/2019 |

(Continued)

OTHER PUBLICATIONS

European Patent Office, International Search Report issued in International Application No. PCT/US2020/061910, dated Mar. 1, 2021.

(Continued)

*Primary Examiner* — Alexis B Pacheco
(74) *Attorney, Agent, or Firm* — Baker Botts L.L.P.

(57) ABSTRACT

The present invention is directed to an electric vehicle charger that may include power electronics, one or more controllers, and one or more cable/connector plugs. The disclosed bi-charger may operate bi-directionally. Power components may be arranged in a charger enclosure in a configuration providing the optimum air flow over a heat sink(s) that will allow the most heat to be moved out of the charger enclosure with the least effort. The disclosed charger may use a combination of forced and natural convection to effectively cool the system. Power stages may be mounted in the enclosure and a control tray may be mounted above the power stages. The disclosed charger may use a three-power stage architecture. The disclosed charger also uses a configuration and method of mounting and positioning the power components within the enclosure that results in a smaller and more power dense piece of equipment.

17 Claims, 14 Drawing Sheets

Related U.S. Application Data filed on Nov. 26, 2019, provisional application No. 62/940,703, filed on Nov. 26, 2019.

(51) Int. Cl.

| | | |
|---|---|---|
| *B60L 53/24* | (2019.01) | |
| *B60L 53/302* | (2019.01) | |
| *B60L 53/50* | (2019.01) | |
| *B60L 53/60* | (2019.01) | |
| *B60L 58/12* | (2019.01) | |
| *H02J 7/04* | (2006.01) | |
| *H02J 7/14* | (2006.01) | |
| *H02M 7/00* | (2006.01) | |
| *H05K 7/20* | (2006.01) | |

(52) U.S. Cl.
CPC ............... *B60L 53/60* (2019.02); *B60L 58/12* (2019.02); *H02J 7/0042* (2013.01); *H02J 7/04* (2013.01); *H02M 7/003* (2013.01); *H05K 7/209* (2013.01); *B60L 2210/12* (2013.01); *B60L 2210/14* (2013.01); *B60L 2210/30* (2013.01); *H02J 2207/20* (2020.01)

(58) Field of Classification Search
USPC ......................................................... 320/109
See application file for complete search history.

(56) References Cited

U.S. PATENT DOCUMENTS

| | | |
|---|---|---|
| 7,599,196 B2 | 10/2009 | Alexander |
| 7,747,739 B2 | 6/2010 | Bridges et al. |
| 7,778,045 B2 | 8/2010 | Alexander |
| 7,783,390 B2 | 8/2010 | Miller |
| 7,844,370 B2 | 11/2010 | Pollack et al. |
| 7,886,166 B2 | 2/2011 | Shnekendorf et al. |
| 7,949,435 B2 | 3/2011 | Pollack et al. |
| 7,957,846 B2 | 6/2011 | Hakim et al. |
| 8,103,389 B2 | 1/2012 | Golden et al. |
| 8,116,915 B2 | 2/2012 | Kempton |
| 8,295,069 B2 | 10/2012 | Alexander |
| 8,300,426 B2 | 10/2012 | Alexander |
| 8,345,452 B2 | 1/2013 | Alexander |
| 8,346,401 B2 | 1/2013 | Pollack et al. |
| 8,391,033 B2 | 3/2013 | Alexander |
| 8,395,910 B2 | 3/2013 | Alexander |
| 8,400,800 B2 | 3/2013 | Alexander |
| 8,406,025 B1 | 3/2013 | Alexander |
| 8,432,711 B1 | 4/2013 | Alexander |
| 8,441,819 B2 | 5/2013 | Alexander |
| 8,446,042 B2 | 5/2013 | Bundschuh et al. |
| 8,446,043 B1 | 5/2013 | Bundschuh et al. |
| 8,446,745 B1 | 5/2013 | Alexander |
| 8,451,637 B1 | 5/2013 | Alexander |
| 8,461,718 B2 | 6/2013 | Bundschuh et al. |
| 8,471,408 B2 | 6/2013 | Bundschuh et al. |
| 8,509,976 B2 | 8/2013 | Kempton |
| 8,676,389 B2 | 3/2014 | Golden et al. |
| 8,781,809 B2 | 7/2014 | Bridges |
| 8,796,881 B2 | 8/2014 | Davis |
| 8,810,192 B2 | 8/2014 | Bridges et al. |
| 8,849,687 B2 | 9/2014 | Hakim et al. |
| 8,855,829 B2 | 10/2014 | Golden et al. |
| 8,862,280 B1 | 10/2014 | Dyess et al. |
| 8,898,278 B2 | 11/2014 | Bridges et al. |
| 8,903,560 B2 | 12/2014 | Miller |
| 9,007,796 B2 | 4/2015 | Alexander |
| 9,013,062 B2 | 4/2015 | Kinomura |
| 9,029,909 B2 | 5/2015 | Blanchard et al. |
| 9,031,708 B2 | 5/2015 | Penzenstadler et al. |
| 9,035,350 B2 | 5/2015 | Blanchard et al. |
| 9,042,131 B2 | 5/2015 | Barron et al. |
| 9,043,038 B2 | 5/2015 | Kempton |
| 9,054,706 B2 | 6/2015 | Blanchard et al. |
| 9,054,707 B2 | 6/2015 | Blanchard et al. |
| 9,059,710 B2 | 6/2015 | Blanchard et al. |
| 9,077,185 B2 | 7/2015 | Alexander |
| 9,116,519 B2 | 8/2015 | Mello |
| 9,118,247 B2 | 8/2015 | Alexander |
| 9,124,095 B1 | 9/2015 | Barron et al. |
| 9,130,461 B2 | 9/2015 | Alexander |
| 9,176,491 B2 | 11/2015 | Dyess |
| 9,190,894 B2 | 11/2015 | Alexander et al. |
| 9,203,400 B2 | 12/2015 | Alexander et al. |
| 9,203,401 B2 | 12/2015 | Alexander et al. |
| 9,209,713 B2 | 12/2015 | Alexander et al. |
| 9,209,798 B2 | 12/2015 | Alexander et al. |
| 9,219,406 B1 | 12/2015 | Alexander |
| 9,231,582 B1 | 1/2016 | Alexander et al. |
| 9,270,142 B2 | 2/2016 | Alexander |
| 9,283,862 B2 | 3/2016 | Bridges et al. |
| 9,293,946 B2 | 3/2016 | Alexander |
| 9,337,262 B2 | 5/2016 | Blanchard |
| 9,355,853 B2 | 5/2016 | Blanchard et al. |
| 9,356,595 B2 | 5/2016 | Alexander et al. |
| 9,369,125 B2 | 6/2016 | Alexander et al. |
| 9,374,084 B2 | 6/2016 | Alexander et al. |
| 9,374,085 B2 | 6/2016 | Alexander et al. |
| 9,397,580 B1 | 7/2016 | Alexander et al. |
| 9,407,133 B1 | 8/2016 | Alexander |
| 9,431,888 B1 | 8/2016 | Alexander |
| 9,436,199 B2 | 9/2016 | Dyess et al. |
| 9,436,948 B2 | 9/2016 | Bridges et al. |
| 9,444,449 B2 | 9/2016 | Alexander et al. |
| 9,520,764 B1 | 12/2016 | Bundschuh et al. |
| 9,614,028 B2 | 4/2017 | Blanchard |
| 9,614,458 B1 | 4/2017 | Alexander |
| 9,647,526 B1 | 5/2017 | Alexander |
| 9,647,553 B2 | 5/2017 | Alexander et al. |
| 9,647,568 B1 | 5/2017 | Bundschuh et al. |
| 9,660,551 B2 | 5/2017 | Alexander |
| 9,674,771 B2 | 6/2017 | Bridges et al. |
| 9,678,519 B1 | 6/2017 | Alexander |
| 9,679,999 B2 | 6/2017 | Blanchard |
| 9,704,381 B2 | 7/2017 | Mello |
| 9,742,385 B2 | 8/2017 | Alexander |
| 9,754,300 B2 | 9/2017 | Kempton et al. |
| 9,786,773 B2 | 10/2017 | Alexander |
| 9,787,298 B2 | 10/2017 | Alexander et al. |
| 9,787,304 B2 | 10/2017 | Alexander et al. |
| 9,796,258 B1 | 10/2017 | Bundschuh et al. |
| 9,818,615 B2 | 11/2017 | Blanchard et al. |
| 9,880,577 B2 | 1/2018 | Dyess et al. |
| 9,899,868 B2 | 2/2018 | Bundschuh et al. |
| 9,899,932 B2 | 2/2018 | Alexander |
| 9,900,002 B2 | 2/2018 | Alexander et al. |
| 10,054,325 B2 | 8/2018 | Dyess |
| 10,056,372 B2 | 8/2018 | Alexander |
| 10,088,185 B2 | 10/2018 | Taylor et al. |
| 10,279,698 B2 | 5/2019 | Bridges et al. |
| 10,406,927 B2 | 9/2019 | Baba |
| 10,434,892 B2 | 10/2019 | Ko |
| 10,630,081 B2 | 4/2020 | Homma |
| 10,724,752 B2 | 7/2020 | Dyess et al. |
| 10,843,580 B2 | 11/2020 | Pollack et al. |
| 10,866,609 B2 | 12/2020 | Dyess et al. |
| 10,892,621 B2 | 1/2021 | Rive et al. |
| 2006/0119512 A1* | 6/2006 | Yoshimatsu .......... H01L 25/112 342/372 |
| 2006/0158037 A1 | 7/2006 | Danley et al. |
| 2007/0203860 A1 | 8/2007 | Golden et al. |
| 2008/0039979 A1 | 2/2008 | Bridges et al. |
| 2008/0040223 A1 | 2/2008 | Bridges et al. |
| 2008/0040263 A1 | 2/2008 | Pollack et al. |
| 2008/0040295 A1 | 2/2008 | Kaplan et al. |
| 2008/0040296 A1 | 2/2008 | Bridges et al. |
| 2008/0052145 A1 | 2/2008 | Kaplan et al. |
| 2008/0249965 A1 | 10/2008 | Pollack et al. |
| 2009/0024545 A1 | 1/2009 | Golden et al. |
| 2009/0040029 A1 | 2/2009 | Bridges et al. |
| 2009/0043519 A1 | 2/2009 | Bridges et al. |
| 2009/0043520 A1 | 2/2009 | Pollack et al. |
| 2009/0066287 A1 | 3/2009 | Pollack et al. |

(56) References Cited

U.S. PATENT DOCUMENTS

| | | |
|---|---|---|
| 2009/0088907 A1 | 4/2009 | Lewis et al. |
| 2009/0228388 A1 | 9/2009 | Axelrod et al. |
| 2011/0001356 A1 | 1/2011 | Pollack |
| 2011/0004358 A1 | 1/2011 | Pollack et al. |
| 2011/0004406 A1 | 1/2011 | Davis |
| 2011/0007824 A1 | 1/2011 | Bridges et al. |
| 2011/0010043 A1 | 1/2011 | Lafky |
| 2011/0016063 A1 | 1/2011 | Pollack et al. |
| 2011/0025556 A1 | 2/2011 | Bridges et al. |
| 2012/0249065 A1* | 10/2012 | Bissonette ............ B60L 53/665 320/109 |
| 2013/0041853 A1 | 2/2013 | Shnekendorf et al. |
| 2014/0049215 A1* | 2/2014 | Fassnacht ............ H02J 7/1423 320/109 |
| 2014/0320083 A1 | 10/2014 | Masuda et al. |
| 2015/0112763 A1 | 4/2015 | Goldschneider |
| 2015/0142193 A1 | 5/2015 | Golden et al. |
| 2015/0160672 A1 | 6/2015 | Hakim et al. |
| 2015/0207319 A1 | 7/2015 | Miller |
| 2016/0016479 A1* | 1/2016 | Khaligh ............... H01F 38/08 336/170 |
| 2016/0204714 A1 | 7/2016 | Alexander |
| 2016/0269021 A1 | 9/2016 | Blanchard |
| 2016/0322350 A1 | 11/2016 | Blanchard |
| 2016/0322484 A1 | 11/2016 | Blanchard |
| 2016/0357209 A1 | 12/2016 | Dyess et al. |
| 2017/0126062 A1* | 5/2017 | Lee ...................... H02J 50/12 |
| 2017/0186107 A1 | 6/2017 | Golden et al. |
| 2017/0222490 A1* | 8/2017 | Boys ..................... H02J 50/12 |
| 2017/0279274 A9 | 9/2017 | Penzenstadler et al. |
| 2017/0282747 A1* | 10/2017 | Wang .................... B60L 58/20 |
| 2017/0288561 A1 | 10/2017 | Lemberg et al. |
| 2017/0317575 A1 | 11/2017 | Alexander |
| 2018/0004239 A1 | 1/2018 | Golden et al. |
| 2018/0026122 A1 | 1/2018 | Blanchard et al. |
| 2018/0037124 A1* | 2/2018 | Jang ...................... B60L 1/00 |
| 2018/0043789 A1* | 2/2018 | Goetz .................... B60L 58/22 |
| 2018/0098271 A1 | 4/2018 | Bridges et al. |
| 2018/0122222 A1 | 5/2018 | Mello |
| 2018/0152095 A1 | 5/2018 | Bai et al. |
| 2018/0170207 A1 | 6/2018 | Ko |
| 2018/0262019 A1 | 9/2018 | Homma |
| 2019/0126763 A1* | 5/2019 | Najmabadi ............... H02J 7/02 |
| 2020/0062138 A1* | 2/2020 | Smolenaers ............ B60L 53/24 |

FOREIGN PATENT DOCUMENTS

| | | |
|---|---|---|
| EP | 2 546 094 A1 | 1/2013 |
| GB | 2 562 532 A | 11/2018 |
| WO | 2010/053872 A1 | 5/2010 |
| WO | 2010091743 A2 | 8/2010 |
| WO | 2018084151 A1 | 5/2018 |
| WO | 2019199964 A1 | 10/2019 |

OTHER PUBLICATIONS

European Patent Office, Written Opinion of the International Searching Authority issued in International Application No. PCT/US2020/061910, dated Mar. 1, 2021.

European Patent Office, Communication Pursuant to Rules 161(1) and 162 EPC issued in European Patent Application No. 20713800.9-1103, dated Oct. 13, 2021.

European Patent Office, International Search Report and The Written Opinion of the International Searching Authority issued in International Application No. PCT/US2020/020309, dated Jul. 27, 2020.

European Patent Office, Invitation to Pay Additional Fees and Where Applicable, Protest Fee and Partial International Search Report issued in International Patent Application No. PCT/US2020/020309, dated Jun. 5, 2020.

Hakim et al., U.S. Appl. No. 12/470,224, entitled "Energy Arbitrage by Load Shifting", filed in the U.S. Patent and Trademark Office on May 21, 2009.

Golden et al., U.S. Appl. No. 15/072,922, entitled "Modular Energy Control System", filed in the U.S. Patent and Trademark Office on Mar. 17, 2016.

Golden et al., U.S. Appl. No. 15/808,120, entitled "Modular Energy Control System", filed in the U.S. Patent and Trademark Office on Nov. 9, 2017.

* cited by examiner

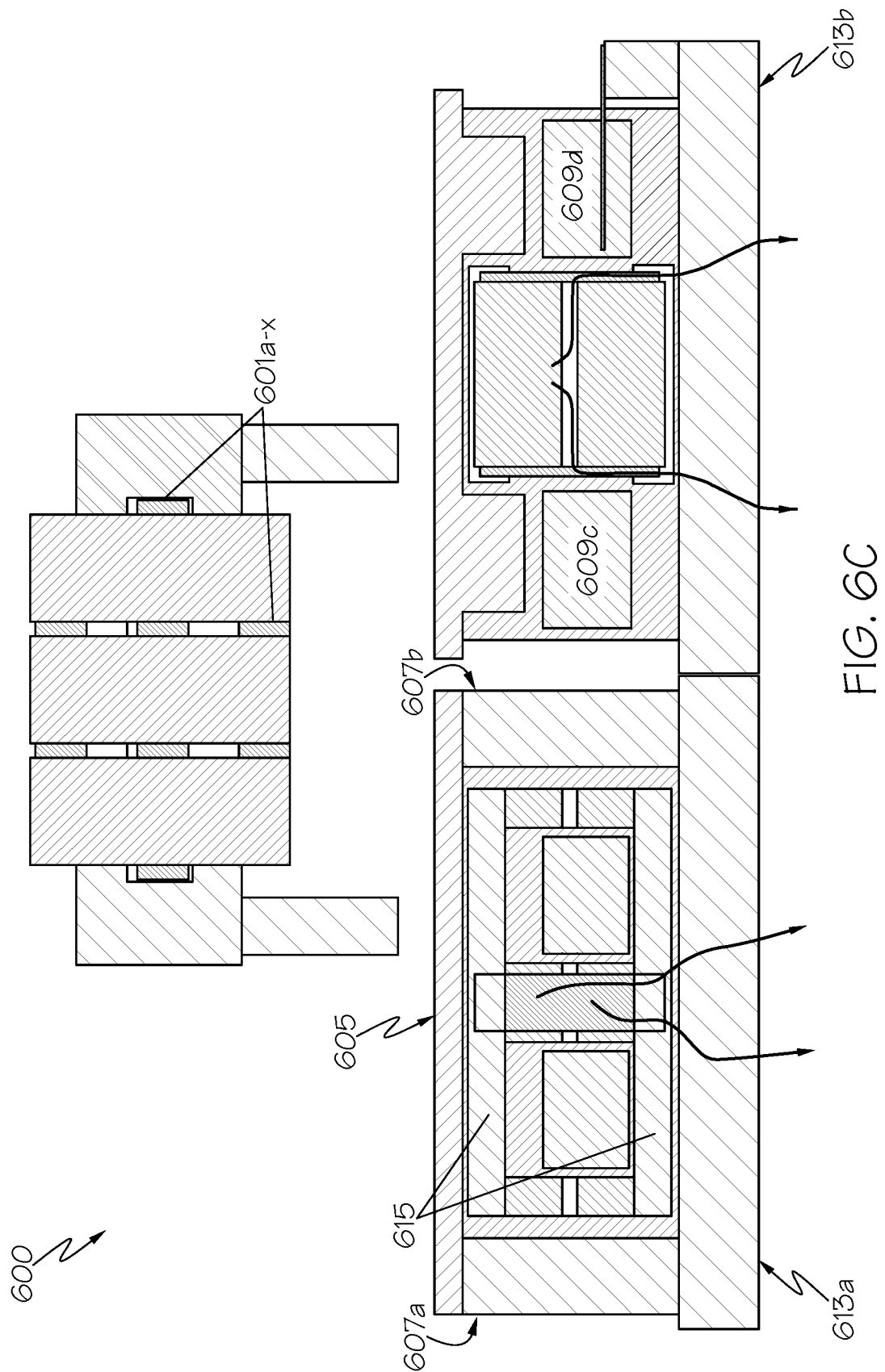

DEVICE FOR BI-DIRECTIONAL POWER CONVERSION AND CHARGING FOR USE WITH ELECTRIC VEHICLES

BACKGROUND

The present disclosure generally relates to a bi-directional power conversion device, in particular a bi-directional charger for use with an electric vehicle. The charger has a bi-directional power conversion structure, or power stage, comprising interconnect devices and power conversion equipment that is configured to charge the batteries of an electric vehicle from the grid or building, and discharge the stored energy of the batteries back into the grid or building. Thus, the disclosed bi-directional charger may be used to optimize revenue generating and/or cost saving activities by providing bi-directional power flow between an electric vehicle and an AC source, such as a utility grid.

As concerns for the environment and depletion of resources increase, the use of plug-in electric vehicles has become more popular. Such vehicles include battery electric vehicles (BEVs), plug-in hybrid electric vehicles (PHEVs), and hydrogen fuel cell electric vehicles (FCEVs). These vehicles typically include one or more electric motors that are powered by one or more batteries. There are different types of electric vehicle batteries, such as lead-acid, nickel metal hydride, sodium, and lithium-ion. Each such battery may be provided in different storage capacities, which are generally measured in kilowatt-hours ("kWh").

As the use of electric vehicles has become more prevalent and the availability of such vehicles has increased, attempts have been made to utilize them in revenue generating and/or cost saving activities, such as vehicle-to-grid activities. Conventional chargers or standard quick chargers for electric vehicles only allow flow in one direction (i.e., power only flows from the charger to the electric vehicle) and are not suitable for vehicle-to-grid activities. Also, the standard quick charger is a slave to the process of charging the electric vehicle. For example, the standard quick charger automatically begins charging operations when plugged into a vehicle, automatically disengages when the vehicle communicates that it is fully charged and does not perform any assessment of the state of the vehicle to determine what operation to perform. The disclosed bi-directional charger provides bi-directional flow of power to charge the electric vehicle and to discharge the electric vehicle into the grid or building. Further, the disclosed bi-directional charger enables assessment of the state of the vehicle to determine what operation to perform and communicates with software to conduct vehicle-to-grid activities.

BRIEF DESCRIPTION OF THE DRAWINGS

A FIGS. 6A-6C are diagrams of aspects of a sidecar design for an isolation stage of a bi-directional charger according to the present disclosure.

In the aforementioned figures, like reference numerals refer to like parts, components, structures, and/or processes.

DETAILED DESCRIPTION OF THE DISCLOSED EMBODIMENTS

Figure 1A:
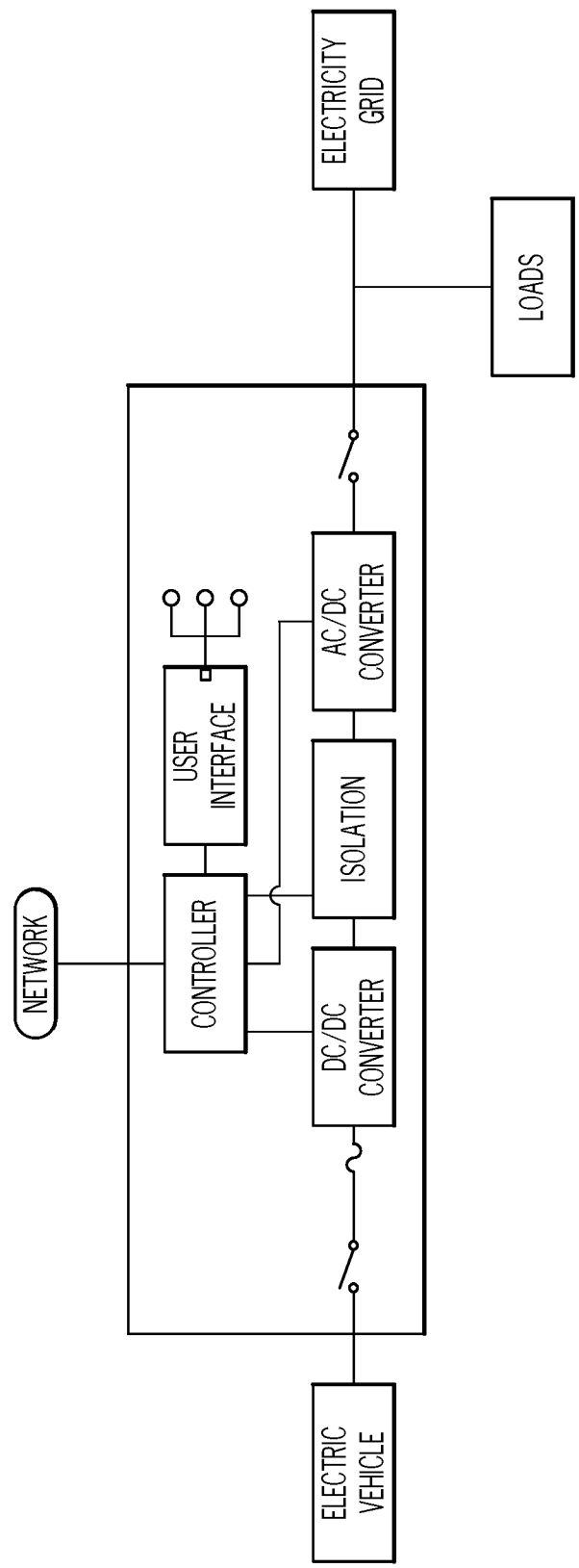
FIGS. 1A-C are diagrams of the basic topology of a bi-directional charger according to the present disclosure.

As will be understood by those of ordinary skill in the art, aspects of the present disclosure may be illustrated and described herein in any of a number of patentable classes or contexts, including any new and useful process, machine, manufacture, or composition of matter, or any new and useful improvement thereof. Accordingly, aspects of the present disclosure may be implemented entirely as hardware, entirely as software (including firmware, resident software, micro-code, etc.), or by combining software and hardware implementations that may all generally be referred to herein as a "circuit," "module," "component," or "system." Furthermore, aspects of the present disclosure may take the form of a computer program product embodied in one or more computer-readable media having computer-readable program code embodied thereon.

Any combination of one or more computer-readable media may be utilized. The computer-readable media may be a computer-readable signal medium or a computer-readable storage medium. A computer-readable storage medium may be, for example, but not limited to, an electronic, magnetic, optical, electromagnetic, or semiconductor system, apparatus, or device, or any suitable combination of the foregoing. More specific examples (a non-exhaustive list) of the computer-readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable signal medium may be transmitted using any appropriate medium, including but not limited to wireless, wireline, optical fiber cable, radio frequency (RF), etc. or any suitable combination thereof.

Computer program code for carrying out operations for aspects of the present disclosure may be written in any combination of one or more programming languages, such as any of the programming languages listed at https://githut.info/ (e.g., JAVASCRIPT, JAVA, PYTHON, CSS, PHP, RUBY, C++, C, SHELL, C#, OBJECTIVE C, etc.) or other programming languages. The program code may be executed by a processor or programmed into a programmable logic device. The program code may be executed as a stand-alone software package. The program code may be executed entirely on an embedded computing device or partly on an embedded computing device (e.g., partly on a server and partly on a personal computer and partly on an embedded device). The program code may be executed on a client, on a server, partly on a client and partly on a server, or entirely on a server or other remote computing device. The program code also may be executed on a plurality of a combination of any of the foregoing, including a cluster of personal computers or servers. The server or remote computing device may be connected to the client (e.g., a user's computer) through any type of network, including a local area network (LAN), a wide area network (WAN), or a cellular network. The connection also may be made to an external computer or server (e.g., through the Internet using an Internet Service Provider) in a cloud computing environment or offered as a service such as a Software as a Service (SaaS).

The bi-directional charger of the present disclosure may be used with any vehicle with a battery that may be utilized as an energy storage asset, including an electric truck, electric bus, electric car, electric forklift, electric motorcycle, electric scooter, electric wheelchair, electric bicycle, etc. (provided it is configured for bi-directional charging). While such batteries are typically found in these types of exemplary vehicles, they also may be found in other mobile energy storage assets. The present disclosure is directed to a bi-directional charger that interfaces with the electric vehicle and application software to optimize battery health during revenue generating and/or cost saving activities so that the batteries remain in optimal condition to power the electric vehicles when not being used for such during revenue generating and/or cost saving activities. The charger may be located within the vehicle as part of its internal charging system or outside of the vehicle as an offboard option that is compatible with existing electric vehicles. An offboard DC fast charger, such as the embodiment disclosed below, provides additional operational value as it can charge at a faster rate than an onboard charger, which may only be 3.6 or 6.6 kW depending on the particular vehicle.

The bi-directional charger of the present disclosure can facilitate power flow from an AC source, such as the utility grid to an electric vehicle or from the electric vehicle to the AC connection. The bi-directional charger of the present disclosure provides a choice of which of those two operations to perform (i.e., grid-to-vehicle or vehicle-to-grid) and interfaces with (or includes) software to determine when and how to perform a particular operation. Unlike a standard quick charger for electric vehicles, the bi-directional charger of the present disclosure would report that it is connected to the electric vehicle and is an available resource, while software would then determine what operation to perform and whether to initiate the operation. The connection to the electric vehicle may be required to have an electrical connection or power flow and a communications path for a protocol for accessing the electric vehicle (i.e., a vehicle communications standard). Several competing vehicle communications standards exist. The bi-directional charger of the present disclosure may use any suitable vehicle communications standard, such as CHAdeMO. The charger may also send messages to the electric vehicle through the communications path.

Aspects of the present disclosure are described herein with reference to flowchart illustrations and/or block diagrams of methods, apparatuses (systems) and computer program products according to embodiments of the present disclosure. It will be understood that each block of the flowchart illustrations and/or block diagrams, and combinations of blocks in the flowchart illustrations and/or block diagrams, can be implemented by computer program instructions. Those computer program instructions may be provided to a processor of a general-purpose computer, special purpose computer, or other programmable data processing apparatus to produce a machine, such that the instructions, which are executed via the processor of the computer or other programmable instruction execution apparatus, create a mechanism for implementing the functions/acts specified in the flowchart and/or block diagram block or blocks.

Those computer program instructions may also be stored in a computer-readable medium that, when executed, can direct a computer, other programmable data processing apparatus, or other devices to function in a particular manner, such that the instructions, when stored in the computer-readable medium, produce an article of manufacture that includes instructions which, when executed, cause a computer to implement the function/act specified in the flowchart and/or block diagram block or blocks. The computer program instructions also may be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

For a more complete understanding of the nature and advantages of embodiments of the present disclosure, reference should be made to the ensuing detailed description and accompanying drawings. Other aspects, objects and advantages of the disclosed embodiments will be apparent from the drawings and detailed description that follows. However, the scope of the disclosed embodiments will be fully apparent from the recitations of the claims.

General Topology of Bi-Directional Charger

In general, an electric vehicle charger may include power electronics, one or more controllers, and one or more cable/connector plugs. The power electronics are located inside any suitable enclosure, which protects the electronic components from the elements. The power electronics are responsible for supplying power to the electric vehicle and include passive components (inductors, resistors, capacitors, transformers), passively and actively switched semiconductor devices (switches, rectifiers, protective devices), and other electronics. The one or more controllers are configured to monitor and control charging functions and network functions. And the one or more cable/connector plugs are configured to connect a charger to an electric vehicle (via its charging port or other connection point) to be charged, sometimes referred to as a cable gun. In an embodiment of a charger according to the present disclosure, the cable/ connector plug may include a locking mechanism to prevent the charger from being disconnected from the electric vehicle (as described in U.S. patent application Ser. No. 16/802,808, which was published as U.S. Patent Application Publication No. 2020/0282855 and is incorporated by reference herein in its entirety).

Charging stations may comprise multiple chargers and may be located in any suitable place, including, but not limited to, public locations, such as a grocery store, where an individual may charge their electric vehicle, or outside a municipal building to service a fleet of electric vehicles owned by a government entity for municipal use.

Figure 1B:
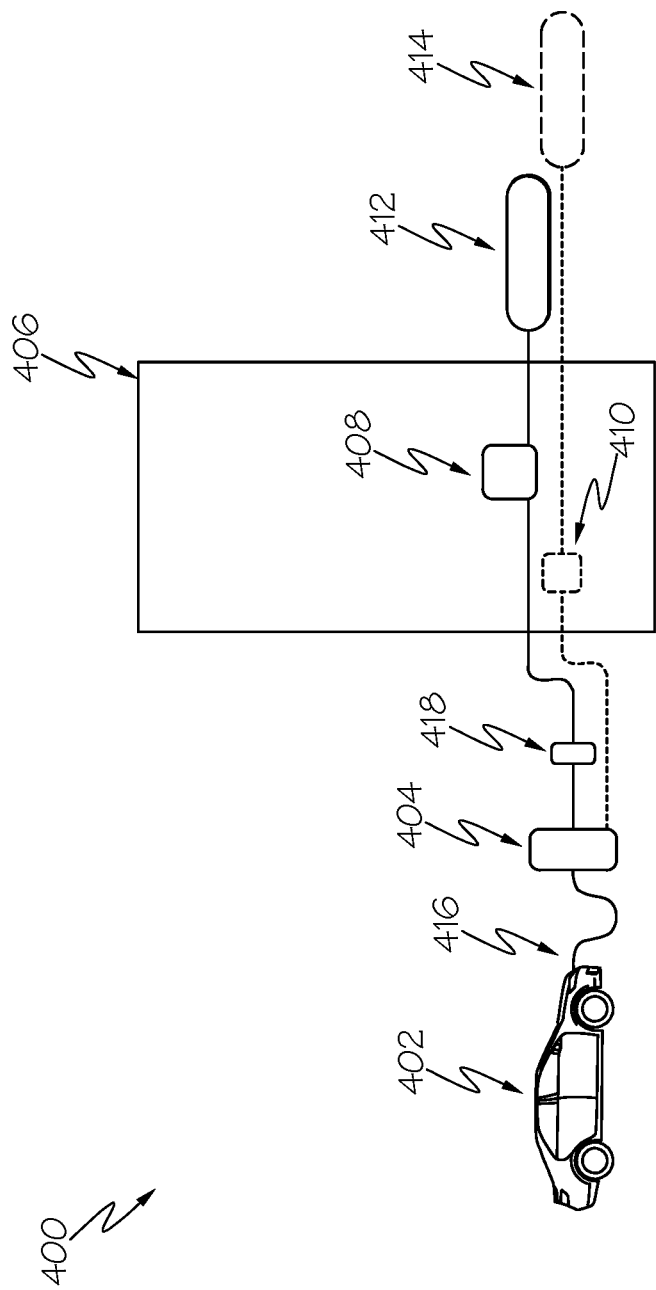

The disclosed bi-directional charger includes a controller, DC/DC converter, isolation stage, and AC/DC converter. The controller may provide a user interface via a local display and buttons, or via communication network, including a local network, gateway, or cloud-based system of application. The AC/DC converter may be connected to an electrical grid, utility grid, or other suitable AC electrical connection point (ECP). The DC/DC converter may be connected to an electric vehicle or other suitable DC electrical connection point (ECP). The controller may be in communication with a network, including a local network, gateway, or cloud-based system of application. This basic topology is depicted in FIGS. 1A and 1B. For example, an electric vehicle 402 may be connected to a bi-directional charger 404 through a quick-change port 416 or other suitable connection mechanism. A disconnect 418 may exist between the charger 404 and building 406. The building 406 has a building electrical panel 408 or other suitable connection mechanism to connect to the grid 412 and a local ethernet port 410 or other suitable connection mechanism to connect to the Internet 414. The controller may also perform commands and tasks as required by specifications for the electric vehicle industry, electric utility industries, or other suitable regulatory or operational control entities. The disclosed bi-directional charger provides high power and efficiency in a smaller package, which allows for wall-mounted options, in turn requiring less labor and equipment to install the chargers.

The local user interface may be any suitable graphical user interface with a display screen and means for user input. For example, the display screen may include a 4×20 character display and 3 buttons for the user to interact with the charger. In addition, the display screen may be angled in such a manner as to keep the screen out of direct sunlight but also be visible from the average person's height. For example, if the display screen is mounted to a wall, the screen may lean forward 5 degrees relative to the wall.

The disclosed bi-directional charger is configured to be used with an electric vehicle implemented in any "X" number of applications, such as vehicle-to-grid applications, vehicle-to-building applications, vehicle-to-home applications, vehicle-to-vehicle applications, etc. (i.e., vehicle-to-X applications, or "V2X"). The differences in each such "X" application are primarily the system with which the electric vehicle is integrated. For example, electric vehicles may be integrated with the electric grid (i.e., vehicle-to-grid) or with a building's electric load in a behind-the-meter system (i.e., vehicle-to-building). A behind-the-meter system is a system comprised of the electrical system that is metered by a utility, such as the electrical system in a commercial building or a private home. The grid may be a larger system that includes everything between a plug and the utility. It should therefore be understood that vehicle-to-building applications, vehicle-to-home applications, vehicle-to-vehicle applications, etc. may be part of, or even referred to as, vehicle-to-grid applications.

The disclosed bi-directional charger is configured to perform charging and discharging operations between an electric vehicle and an AC electrical connection point, such as the utility grid, a microgrid, an AC branch circuit, or other suitable electric grid. However, the bi-directional charger could also be used to provide power conversion and flow between any suitable DC electrical connection point and AC electrical connection point. This could be done by modifying the input and output mechanisms, such as the cable/connector plug, as required to suit the application.

The rate of charge and discharge of the disclosed bi-directional charger may be controlled or restricted based on communication in terms of maximum current levels (either charging or discharging current polarity) or as maximum power levels (in Watts). These levels may be determined by the technical capability of the bi-directional charger. In another embodiment, the rate of charge and discharge of the disclosed bi-directional charger may also be a function of both the charger itself and the electric vehicle. Electric vehicles as part of their communication protocol may communicate the maximum limits the vehicle can support to the charger. The maximum limits for the electric vehicle may be defined by the vehicle manufacturer and typically constrain vehicle power capability in terms of battery warranty. The charger may then default to a level that is satisfactory to both the charger and the electric vehicle managing the maximum power that is supported on a technology level by the charger and limits in software to maintain the battery warranty terms of the electric vehicle. For example, the bi-directional charger itself could support a maximum of 15 kW, while the electric vehicle may only support a maximum of 10 kW. Thus, the bi-directional charger would default to 10 kW or less to maintain the battery warranty.

The disclosed bi-directional charger may support 220-500 volts (V) DC on the DC side, which may be the interface to the electric vehicle. This range covers specifications for the Nissan LEAF and other electric vehicles on the market. However, any suitable range of voltage levels and other operational specifications may be used depending on the electric vehicle communication standard being used (e.g., CHAdeMO or CCS specifications). On the AC side of the disclosed charger, the grid connection provided may be a standard utility grid connection. This may be a three-phase, 480 V connection as typically seen in industrial equipment in a factory setting. Alternately, the utility grid connection may be a single phase connection appropriate for residential or home usage when used in conjunction with an appropriate AC transformer. Further, the disclosed bi-directional charger may be used indoors and outdoors. The disclosed charger may accommodate a range of environmental conditions and may operate in an ambient temperature range of −20° C. to 40° C.

The disclosed bi-directional charger may use a distributed software environment where command and control of the charger may be performed through any suitable interface, as described in more detail below. This interface may also allow software that is stored in the cloud or on another suitable external server to connect to the charger. The charger may use the interface to obtain information and issue commands. For example, in U.S. patent application Ser. No. 16/802,808 (published as U.S. Patent Application Publication No. 2020/0282855), which is incorporated by reference herein in its entirety, the disclosed charger may communicate with such software to engage in revenue generating activities. The disclosed bi-directional charger may also have the ability to perform remote firmware updates as needed on the device. This may allow for correction of software problems or the ability to add new features and controls to the charger, such as the ability to perform additional revenue generating activities.

Figure 1C:
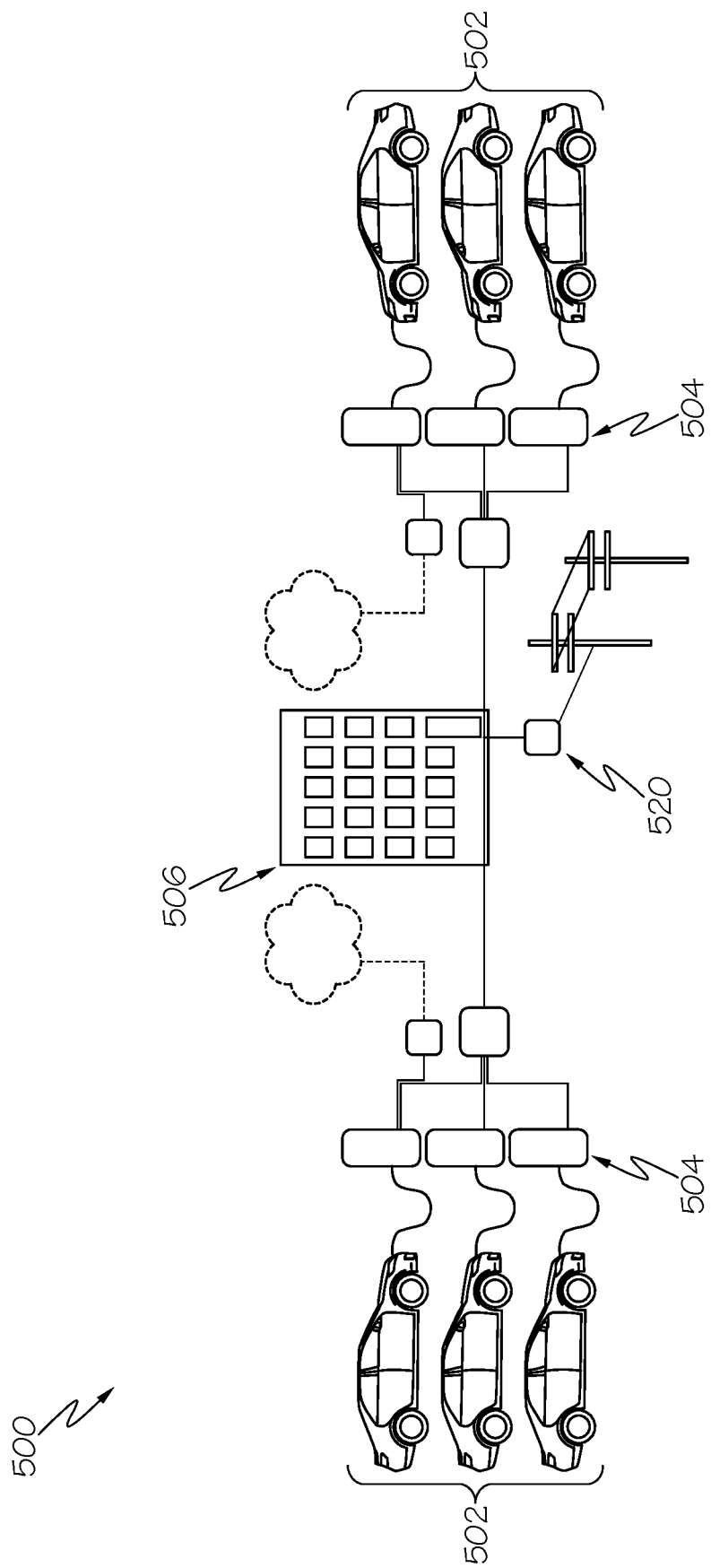

While the present disclosure primarily relates to the operation of one charger, multiple chargers may be placed and used in parallel. For example, a V2X system 500 for engaging revenue generating and/or cost saving activities is depicted in FIG. 1C that includes a fleet of electric vehicles 502 connected to bi-directional chargers 504 connected to building 506 behind the building's utility meter 520. Each vehicle connects to the building in a similar manner using the components depicted in FIG. 1B. Although the exemplary embodiment of FIG. 1C is depicted with six (6) bi-directional chargers, any suitable number of bi-directional chargers may be used depending on the needs of the particular building and/or availability of and number of electric vehicles able to be scheduled. For example, the software could instruct any suitable number of chargers 504, such as two, simultaneously to be charging or discharging in order to achieve the desired effect for the facility's overall load situation. One of the chargers 504 may send a message to a particular electric vehicle that connects to it where the message may be instructing the user to plug the particular electric vehicle into a different charger (e.g., one of the other five (5) chargers 504), so the present charger may remain open for a vehicle that has a battery that is capable of being discharged into the grid (as described in U.S. patent application Ser. No. 16/802,808, which was published as U.S. Patent Application Publication No. 2020/0282855 and is incorporated by reference herein in its entirety).

Three Power Stage Architecture

Figure 7:
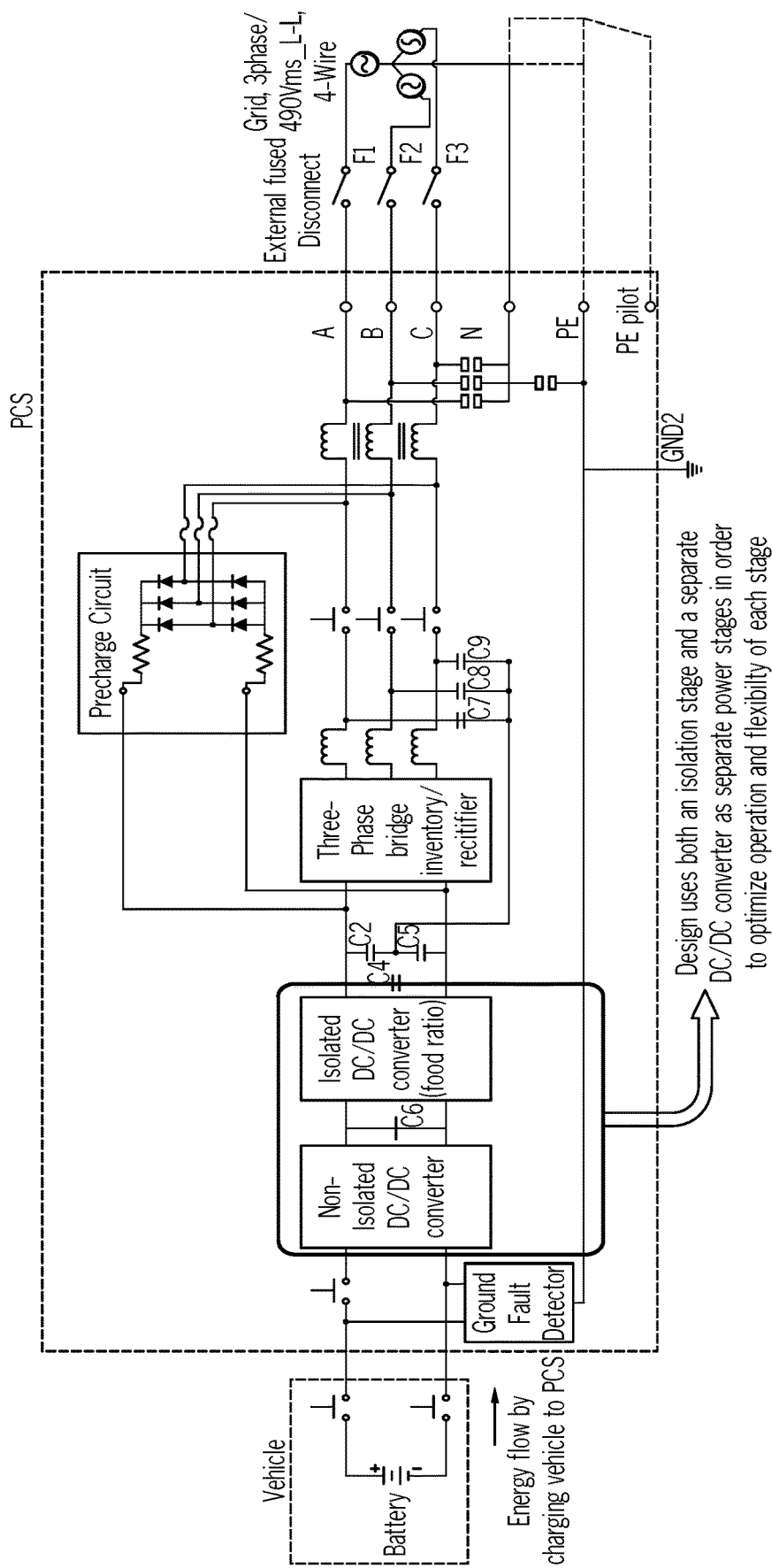
FIG. 7 is a diagram of the basic topology of the power stages of a bi-directional charger according to the present disclosure.
Figure 8:
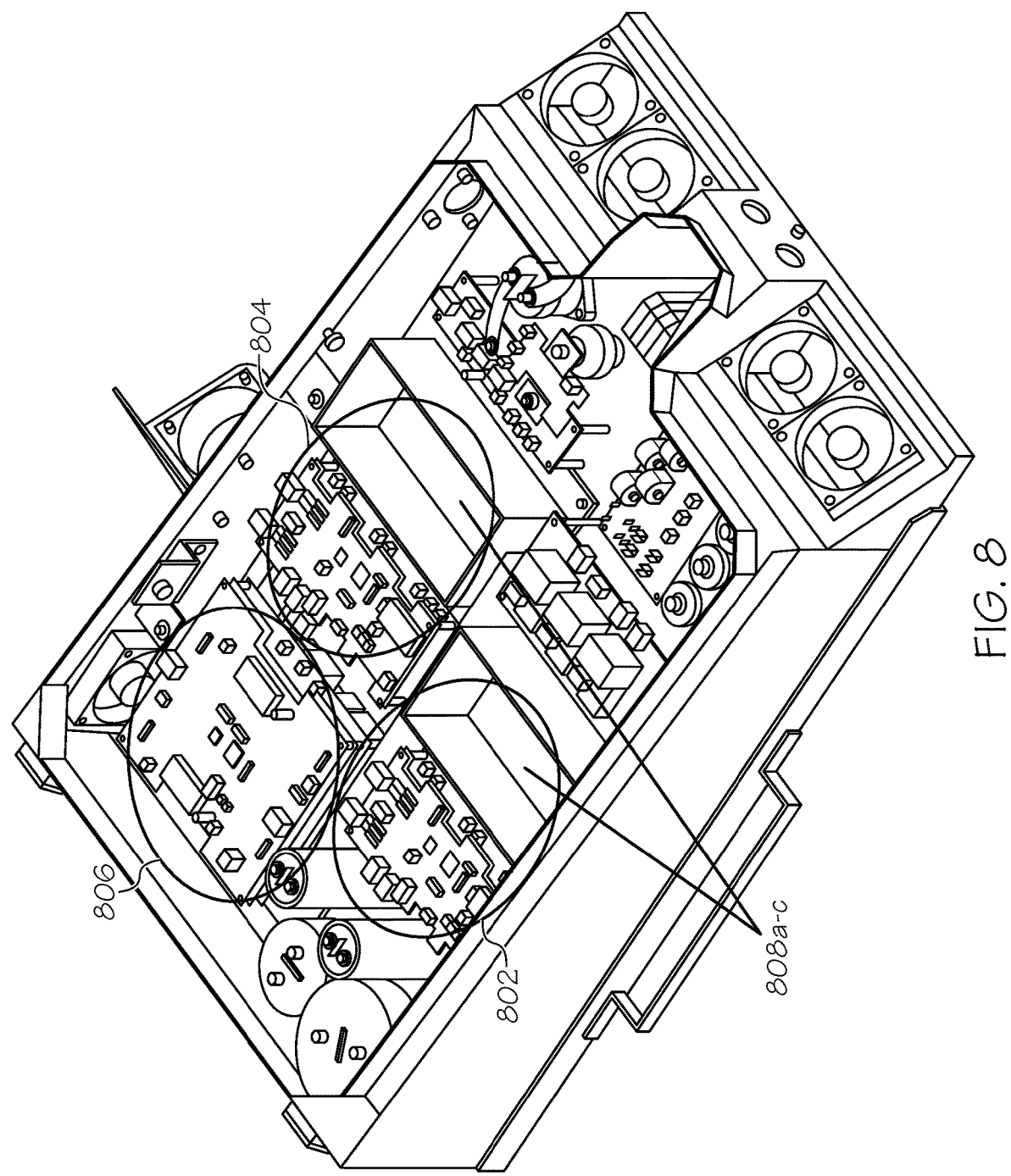
FIG. 8 is an overview of the power stage level of the electronics of a bi-directional charger according to the present disclosure.

As described above and depicted in FIGS. 7 & 8, the bi-directional charger of the present invention may include a three-stage architecture: 1) an AC/DC power stage 802 on the utility grid side; 2) a DC/DC power stage 804 on the electric vehicle side; and 3) an isolation power stage 806. The three power stages 802, 804, 806 may operate independently to provide a higher level of control when directing power through the charger. Command and control of the charger may be performed through an ethernet based communications interface that can be connected to the Internet, and control of the charger may be through a Distributed Network Protocol 3 (DNP3) interface to provide status registers and control options. Ethernet and DNP3 are merely exemplary and any suitable network connection and interface protocol may be used. This interface may also allow software (such as the software described in U.S. Provisional Patent Application No. 62/814,712, incorporated by reference in its entirety herein) that is stored in the cloud or other suitable external server to connect to the charger. Such software may use the interface to obtain information, such as the status of the connected vehicle, and issue commands to perform charge/discharge operations, to engage in revenue generating activities (such as those described in U.S. Provisional Patent Application No. 62/814,712, incorporated by reference in its entirety herein), or for the bi-directional charger to enter a low power state.

Each of the three power stages 802, 804, 806 described above may have a local processor. These local processors run software for control of the specific hardware that it is attached to (the power stage 802, 804, or 806 in this case) and the switching that occurs there. In addition, a number of embedded controls that are coded into the software run on the local processors. There is also a separate, larger processor that performs 3 functions: 1) communicating to and managing/controlling the power stage processors; 2) managing the communications to the electric vehicle (where the CHAdeMO protocol or other suitable electric vehicle communication standard is implemented); and 3) providing external communications interface through the ethernet port to the outside world (where the DNP3 interface, or other suitable interface, is implemented and made available). Control of the overall system may use separate control of the AC/DC stage and DC/DC stage. For example, unlike a grid-tied system, in which the DC/DC converter regulates DC bus voltage and the AC/DC converter regulates current to the grid, the disclosed bidirectional charger may be configured to operate as a stand-alone system, in which the DC/DC converter regulates the electric vehicle current and the AC/DC converter regulates load voltage.

The DC/DC stage of the disclosed bi-directional charger may include discrete silicon carbide (SiC) devices and may be a non-isolated DC/DC power converter with 50 kHz switching frequency and interfacing with or accepting the 150-500V, 100A (or ADC) from the electric vehicle. The DC/DC stage may be a simple 3-phase bi-directional half-bridge topology and may use high-frequency phase interleaving for very low output current ripple. The DC/DC stage may provide nominal 610 VDC to the isolated stage (ISO). The isolation stage (ISO) may be an isolated DC/DC power converter with 250 kHz switching frequency CLLC resonant converter. The ISO stage may provide galvanic isolation through a 1:1.4 voltage ratio planar winding transformer. In addition, a fixed duty cycle and fixed frequency operation near resonance maximizes throughput efficiency.

The DC/AC power stage of the disclosed bi-directional charger may be a non-isolated DC/AC power converter with 50 kHz switching frequency and 30 Arms/phase inductor design. The DC/AC power stage may include discrete silicon carbide (SiC) devices and a 3-phase bi-directional half-bridge topology. And the disclosed bi-directional charger may be configured to use high-frequency switching to minimize line filter component size in the DC/AC power stage.

The above-described configuration results in ability to optimize operation and flexibility of each stage. By using both an isolation stage and a separate DC/DC converter as separate power stages, the isolated stage function may be optimized and performed with very high efficiency and voltage conversion may similarly be optimized for maximum efficiency in the DC/DC stage. However, in an alternate embodiment, the DC/DC and ISO stages may be combined, in which case the disclosed bi-directional charger may be configured to include galvanic isolation in the isolated DC/DC stage.

As another alternative embodiment, the DC/DC stage of the disclosed bi-directional charger may include discrete gallium nitride (GaN), rather than discrete silicon carbide (SiC) devices.

The disclosed bi-directional charger may include a two-stage system with AC/DC and DC/DC stages, such as those described above, provided in an enclosure with an AC quadrant where the AC power is brought in, then run through a set of boards where the noise is filtered from the AC flow. It is then run through a set of contactors to turn it on and off before being sent through the AC/DC system to convert it to DC before being run over to the DC/DC system. This AC/DC converter hardware may sit on a heat sink. The DC/DC system may be an identical piece of hardware to the AC/DC system but function differently in software. When the energy reaches the DC/DC system, it is run through another set of contacts and capacitors before being sent out to the electric vehicle.

In this alternative embodiment, galvanic isolation is provided between the grid and the electric vehicle to provide the required isolation, because there may be no direct connection from one side to the other, although energy may pass from one side to the other. This is to prevent one side from becoming electrified if the other side were to short circuit or have another issue.

Such isolation may be implemented by installing a transformer between the grid and the bi-directional charger to create the needed galvanic isolation, such as a 60 Hz, passive isolation transformer on the AC ECP side. However, this configuration is more costly to deploy because these types of transformers are large pieces of expensive equipment.

In the preferred embodiment of the disclosed bi-directional charger, the isolation implemented by the disclosed bi-directional charger includes a high-voltage, high-frequency isolation stage within the power electronics enclosure of the charger, and thus can be deployed with the charger. To this end, the disclosed bi-directional charger utilizes two separate power stages to accomplish the separate functions of 1) galvanic isolation from the electric vehicle side to utility grid side and 2) DC voltage conversion to match the HV (high-voltage) DC bus voltage to the variable DC voltage of the electric vehicle.

This isolation stage 806 may sit between the AC and DC power stages and may include discrete silicon carbide (SiC) devices. Each power stage (AC/DC 802, ISO 806, DC/DC 804) has its own heat sink, where the AC/DC and DC/DC stages include identical inductor assemblies 808a-c bolted to the respective heat sink and the ISO stage includes a transformer on its heat sink. The three power stages together may include 10 phase legs, which may constitute 20 power FETs, each on a mounting block/heat sink that is connected to the corresponding stage heat sink. A stirring fan may provide circulation of air within the sealed compartment. The isolation stage start/stop operation may be coordinated with the system start in order to minimize current surge stresses in the DC transformer of the isolation stage without the need for current sensing or complex current limiting methods.

As part of an example energy flow through the three stages, AC power is brought in from the grid, such as three-phase electric power, which is the switched to high voltage DC (e.g., up to 1000 VDC), and connected to a capacitor placed on one side of the isolation stage. The isolation stage may be a 1.4:1 ratio isolation stage, i.e., if the high voltage side of the transformer is 1000 V, then the low voltage side of the transformer will be at approximately 714 VDC. Thus, the transformer reduces a higher DC voltage to a lower DC voltage that is then sent to the DC/DC stage. The voltage on the ISO side of the DC/DC converter is reduced (bucked) to the DC voltage of the connected electric vehicle battery. In this way the disclosed bi-directional charger may be described as a buck-boost converter since it may buck the voltage from the ISO stage to the electric vehicle when considering power flow from the disclosed bi-directional charger to the electric vehicle and it boosts the voltage from the electric vehicle to the ISO stage when considering power flow from the electric vehicle to the disclosed bi-directional charger.

Electric vehicle manufacturers may define the conditions, such as maximum current and voltage, at which the electric vehicle batteries must be charged, including conditions to maintain battery warranty. Parameters based on these conditions can be provided to the disclosed bi-directional charger to control the system and ensure the voltage is properly conditioned for charging the electric vehicle batteries. The disclosed bi-directional charger may send a voltage and current rating to charge electric vehicle batteries in accordance with the manufacturer parameters.

Four-Quadrant Operation

Figure 9:
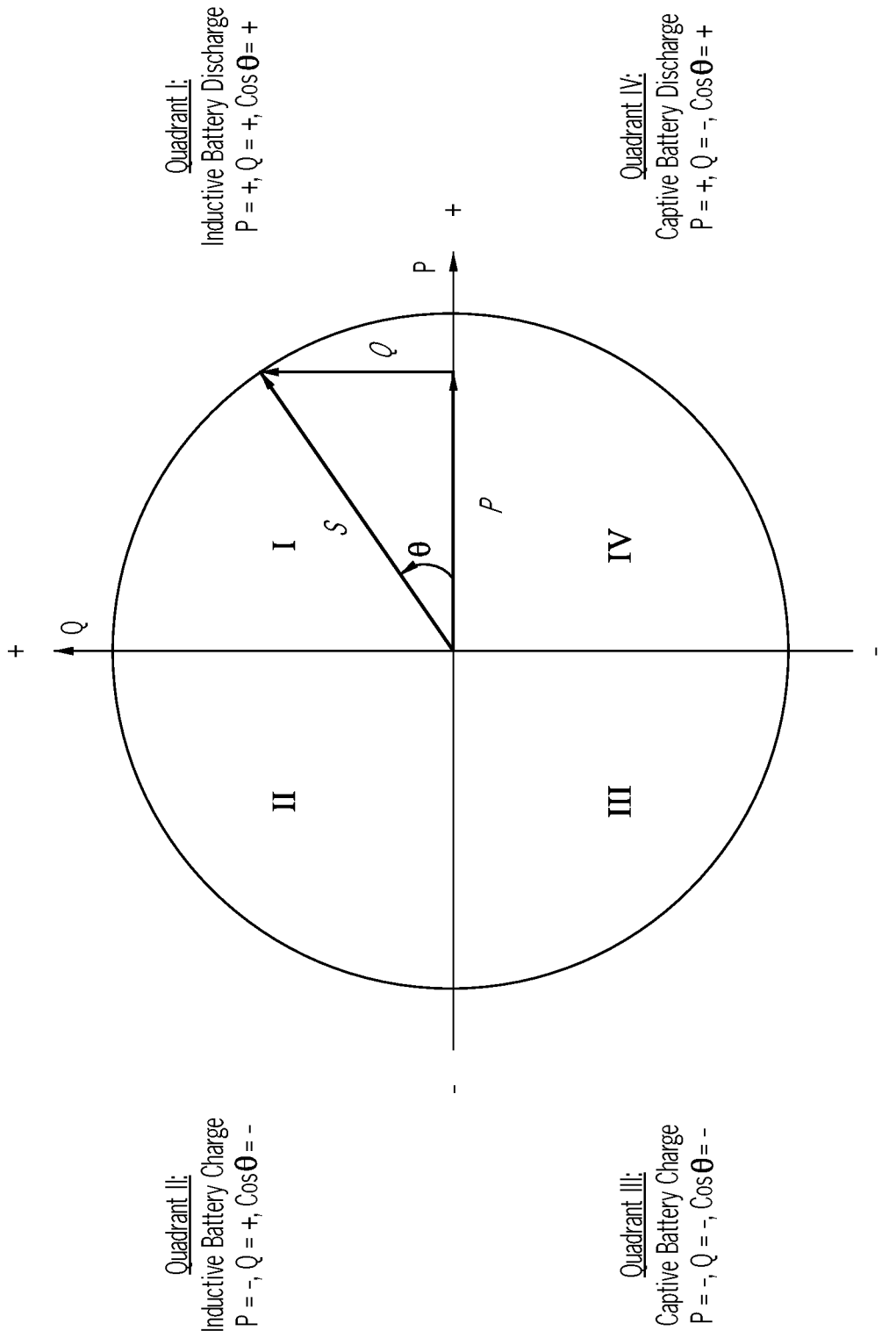
FIG. 9 is a diagram depicting the four quadrants of four-quadrant operation of an on-board or off-board power converter according to the present disclosure.

The disclosed bi-directional charger also may be configured to implement four-quadrant operation of its on-board or off-board power converter. As depicted in FIG. 9, the disclosed bi-directional charger is configured to perform inductive discharging of a vehicle battery in the first quadrant ("Quadrant I" in FIG. 9), which corresponds to a condition in which both reactive power ("Q" in FIG. 9) and effective power ("P" in FIG. 9) are positive. The disclosed bi-directional charger is configured to perform inductive charging of a vehicle battery in the second quadrant ("Quadrant II" in FIG. 9), which corresponds to a condition in which reactive power ("Q" in FIG. 9) is positive but effective power ("P" in FIG. 9) is negative. The disclosed bi-directional charger is configured to perform capacitive charging of a vehicle battery in the third quadrant ("Quadrant III" in FIG. 9), which corresponds to a condition in which both reactive power ("Q" in FIG. 9) and effective power ("P" in FIG. 9) are negative. And the disclosed bi-directional charger is configured to perform capacitive discharge of a vehicle battery in the fourth quadrant ("Quadrant IV" in FIG. 9), which corresponds to a condition in which reactive power ("Q" in FIG. 9) is negative and effective power ("P" in FIG. 9) is positive. The cosine of the resulting angle of these two power components ("θ" in FIG. 9) in each of these conditions is +, −, −, + and places the resulting radius ("S" in FIG. 9) in the first, second, third, and fourth quadrants, respectively.

The disclosed bi-directional charger is configured to be operated with an apparent power circle defined by radius $S=\sqrt{(P^2+Q^2)}$ in any of the four quadrants when it receives the corresponding power effective power and reactive power commands, P and Q, respectively. And the disclosed bi-directional charger may be configured to prioritize the quadrant and/or condition in which it operates. For example, priority could be given to effective power P over reactive power Q such that the bi-directional charger first attempts to establish a condition in which effective power P is the dominant component of S before attempting to establish a condition in which reactive power Q is the dominant component of S. In this example, and for a power converter with a programmable apparent limit of 30 kVA, the following priority may be established:

| Priority | P Requested | Q Available |
|---|---|---|
| 1 | 30000 | 0 |
| 2 | 25000 | 16583 |
| 3 | 20000 | 22361 |
| 4 | 15000 | 25981 |
| 5 | 10000 | 28284 |
| 6 | 5000 | 29580 |
| 7 | 0 | 30000 |

Utilizing such a four quadrant configuration in the power converter allows the disclosed bi-directional charger to function with purely reactive power sourcing that does not drain or charge the vehicle batteries. It also allows for a programmable power factor, programmable VAr as a function of any remote or locally sensed variable, and VAr sourcing or sinking independent of the charge or discharge operation.

Thermal Management

As described above, the disclosed charger may be intended for outdoor use. In order to be rated for outdoor use, the components of the charger must be properly positioned within an enclosure that is properly sealed, e.g., with gaskets, caulked, etc. The electronic components of the charger generate heat and in order to optimize functionality and power efficiency, the charger's components require proper cooling. The disclosed bi-directional charger includes a clean box or enclosure with the electronics inside, with heat sinks positioned with the electronic components inside the enclosure, sealed with a gasket, and a chimney with fins carrying heat from inside the enclosure to outside the enclosure.

Figure 2:
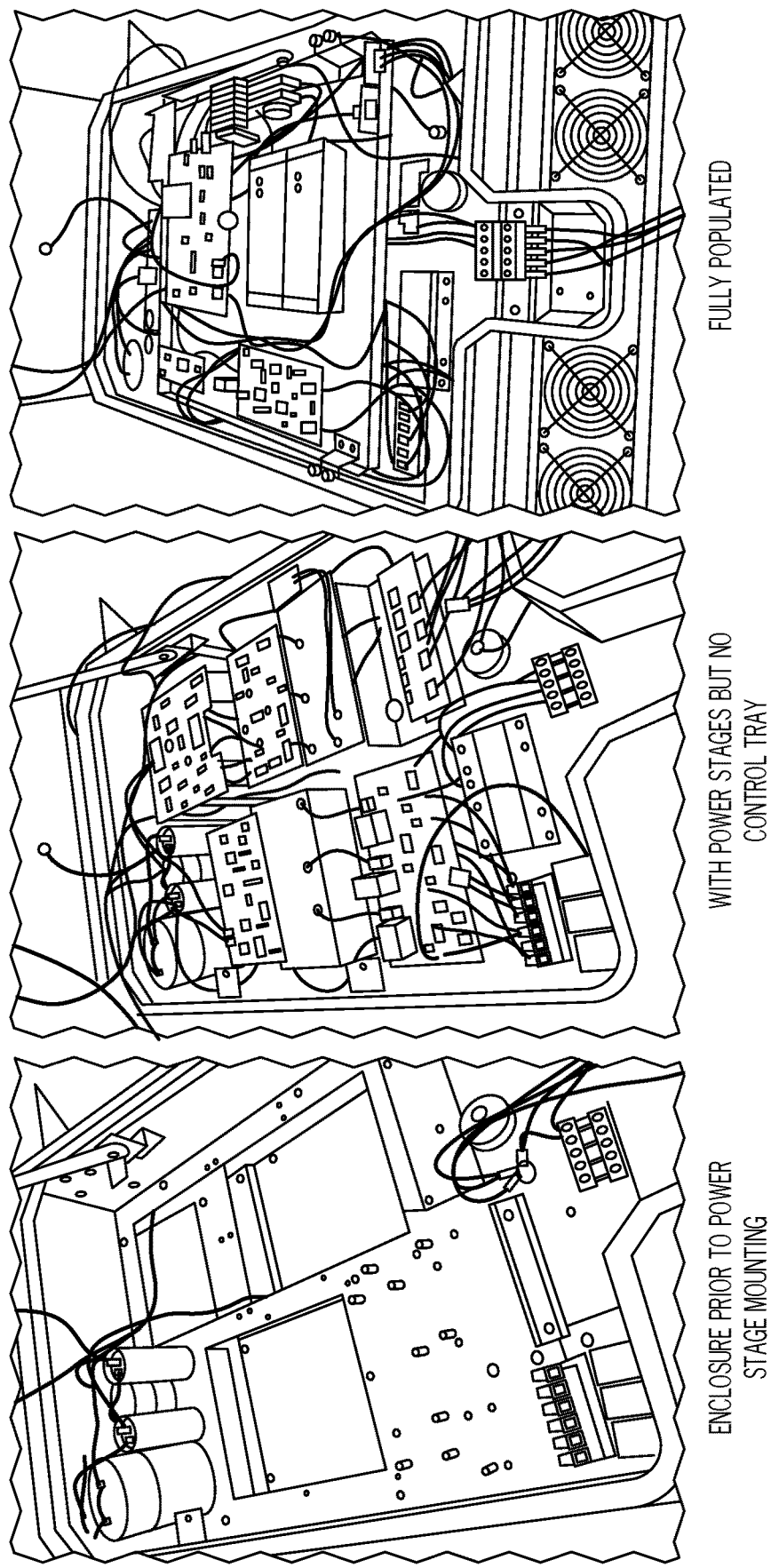
FIG. 2 provides views of an electronics enclosure of a bi-directional charger according to the present disclosure.

The internal components of the disclosed charger may be arranged in the enclosure in a configuration that provides the optimum air flow over the heat sink(s) that will allow the most heat to be moved out of the charger enclosure with the least effort. The disclosed charger may use a combination of forced and natural convection to cool the system. The power stages may be mounted in the enclosure and a control tray may be mounted above the power stages (i.e., a sandwich configuration, as depicted in FIG. 2).

Figure 3:
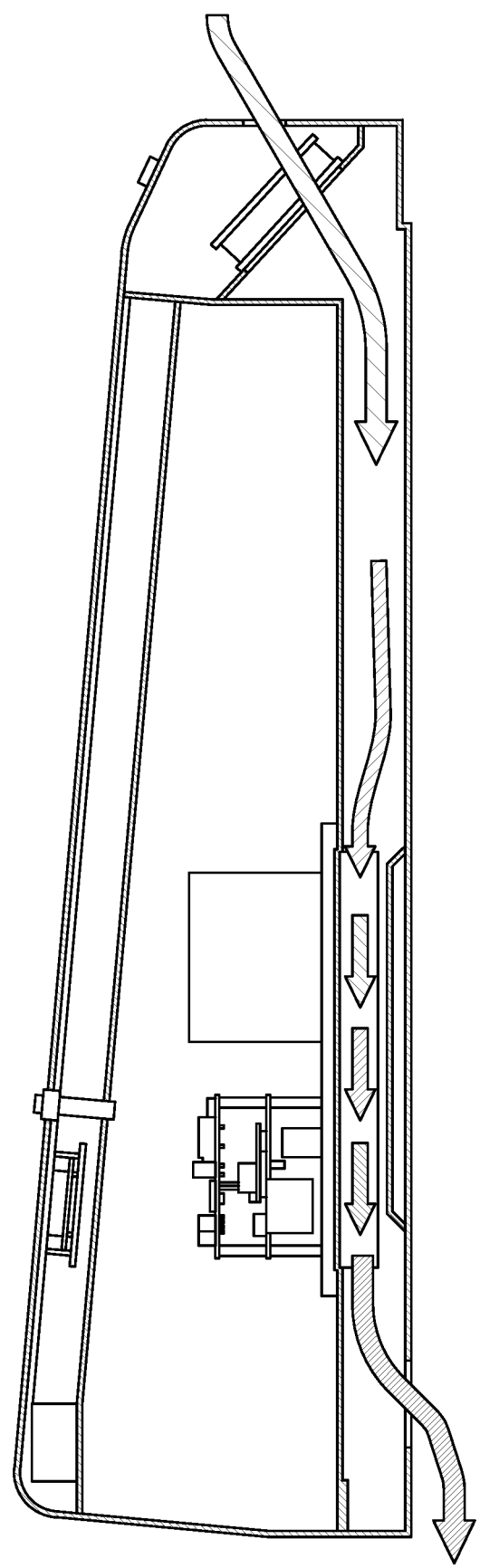
FIG. 3 is a diagram of airflow through the AC/DC tunnel path according to an embodiment of the present disclosure.
Figure 4:
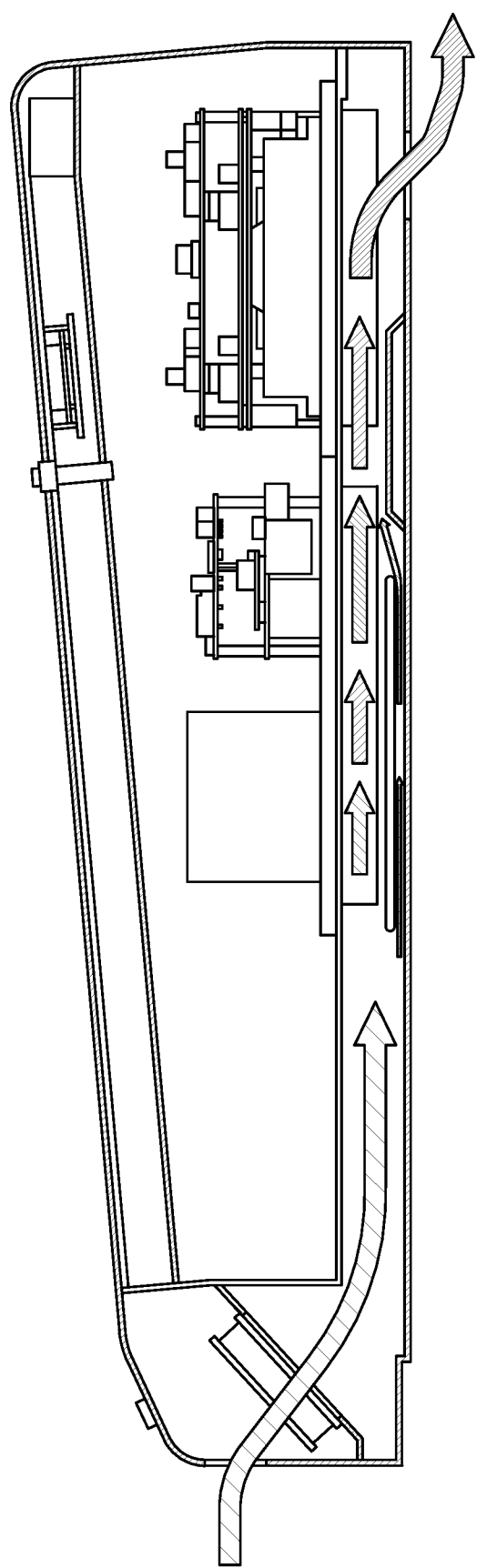
FIG. 4 is a diagram of airflow through the DC/DC ISO tunnel path according to an embodiment of the present disclosure.
Figure 5:
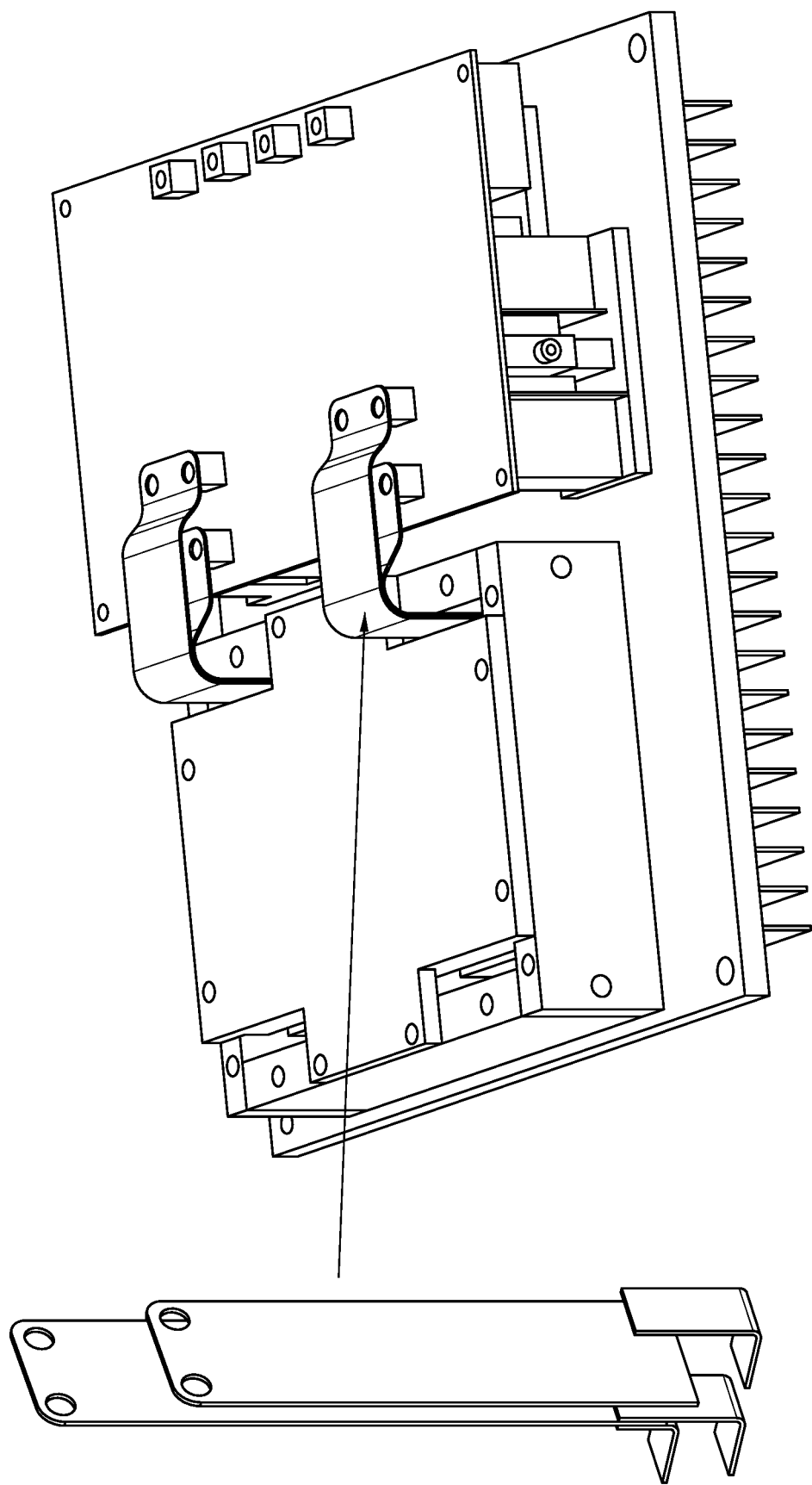
FIG. 5 is a diagram of a sidecar design for an isolation stage of a bi-directional charger according to the present disclosure.

The disclosed bi-directional charger may use mirror image chimneys for the AC/DC and DC/DC stages and the DC/DC stage may share its tunnel leading to its chimney with the isolation stage. FIG. 3 depicts the air flow through the AC/DC tunnel path, while FIG. 4 depicts the air flow through the DC/DC ISO tunnel path. In another embodiment, the isolation stage and DC/DC stage may have their own tunnels. In the shared tunnel embodiment, a plate may be provided to split the air flowing through the tunnel in half. A plenum or volume of air may be pressurized before it begins flowing down the tunnel, then in a chamber just after the fins, that plenum or volume of air may be split into two different paths where half of the air flows through the DC/DC stage chimney and half of the air flows under a plate to the isolation stage. This configuration ensures that hot air is not blown directly from the DC/DC stage onto the isolation stage. Instead the air reaching the isolation stage is approximately half ambient air and half air from the DC/DC stage. This results in cooler air reaching the isolation stage relative to the temperature of the air directly after leaving the DC/DC stage.

Because there is cooler air reaching the isolation stage, the isolation stage can run harder and the losses can be greater. This results in an isolation stage operating at higher efficiency and higher power level. Due to the disclosed packaging, the internal electronics are kept separate from the cooling tunnel such that the only parts exposed to the elements are the fans in the cooling tunnel inlet.

The isolation (ISO) stage described above may have a "sidecar" design (FIGS. 5 and 6A-C) where the transformer is arranged beside an ISB/ICC (Isolation Stage Board/Isolation Control Card) stack up rather than beneath it. Interconnection from windings to the ISB may be done using termination strips designed to land at specific termination points on the ISB. The design of the termination strips leads to effective and efficient operation of the isolation stage while also allowing for effective thermal management of the transformer. This design may integrate the transformer with a high frequency (e.g., 250 kHz) resonant converter bridge on the HV and LV side using optimized low-inductance interconnects. These maintain low leakage inductance and reduce losses that are inherent in high-frequency operation.

Design of Heat Sink Fins

The disclosed bi-directional charger enclosure may use a back-mount heat sink that is an extruded piece of aluminum. The disclosed bi-directional charger enclosure may use a heat sink profile that allows air to pass between the fins along the direction of the extrusion. The air passes between the fins in a manner similar to walking between aisles of library stacks. The heat sink profile is optimized for a forced convection system (e.g., the above described pressurized plenum of air not merely hot air moving from bottom to top). The profile for the DC/DC/ISO stage tunnel may be 10 inches wide and have a section cut out so the profile may sit through an aperture in the enclosure and sealed with a gasket. This provides approximately 8.5 inches of fins. In an example embodiment of the disclosed bi-directional charger, the fins may be spaced 400 mils (where a mil=1/1000 of an inch) from each other. Accordingly, the profile may have approximately 22 fins total. The fins may be an inch long. This same profile may be used but cut to a different length depending on the needs of the system. For example, the AC/DC stage may use an 11.5-inch-long heat sink.

Method of Mounting Transformers in the Charger Enclosure

In general, the smaller an inductor or transformer is for its specific power level, the hotter it becomes. Because the components used in the disclosed bi-directional charger are being effectively cooled, as described above, they can be designed smaller for use in the disclosed charger. In addition to the cooling path described above, the configuration and method of mounting and positioning the components within the enclosure results in a smaller and more power dense piece of equipment. This provides the benefit of leveraging the technology of high-frequency switching devices while providing cost savings in terms of the amount of weight that must be carried to deploy the charger and the amount of material being used to manufacture the product (e.g., less copper and smaller cores are needed if the components are smaller).

The power component devices ("devices or SiC devices") (also referred to as FETs or MOSFETs) may be from any suitable manufacturer of semiconductors suitable for use with electric vehicles, such as silicon carbide MOSFETs (metal-oxide-semiconductor field-effect transistor) from any suitable electronics manufacturer.

The SiC devices or FETs/MOSFETs are mounted to the heat sinks in the charger enclosure in such a way that the devices and heat sinks are in intimate contact to minimize air between them because any air or gaps between the devices and heat sink could prevent removing all heat from the device, which would decrease efficiencies. Thus, a way to firmly press the devices against the heat sink while also insulating them was developed for the disclosed bi-directional charger.

It is desirable for the drive signals for the switching devices to be tightly coupled to the MOSFET. Thus, to maintain signal integrity, the arrangement of the devices and positioning of the devices on the boards to create a path from the switching device drivers to the switching devices was designed to minimize the path length. The disclosed mounting of discrete semiconductor switches (SiC devices) meets creepage and clearance requirements while also allowing for disassembly and intimate connection to heat sink blocks. The transformer and MOSFET cooling systems may be integrated into a single assembly to conduct heat to the cooling tunnel.

Figure 6A:
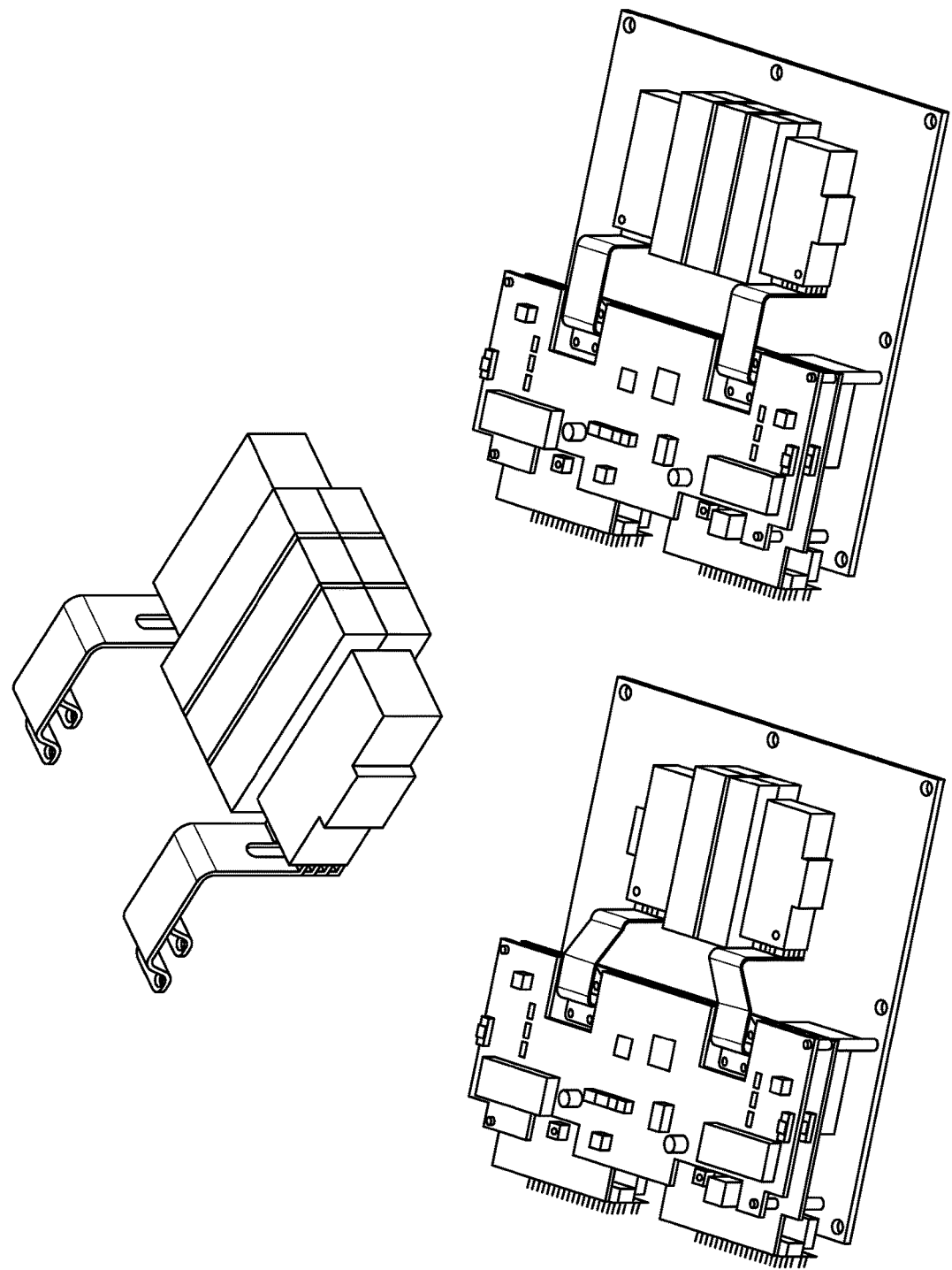
Figure 6B:
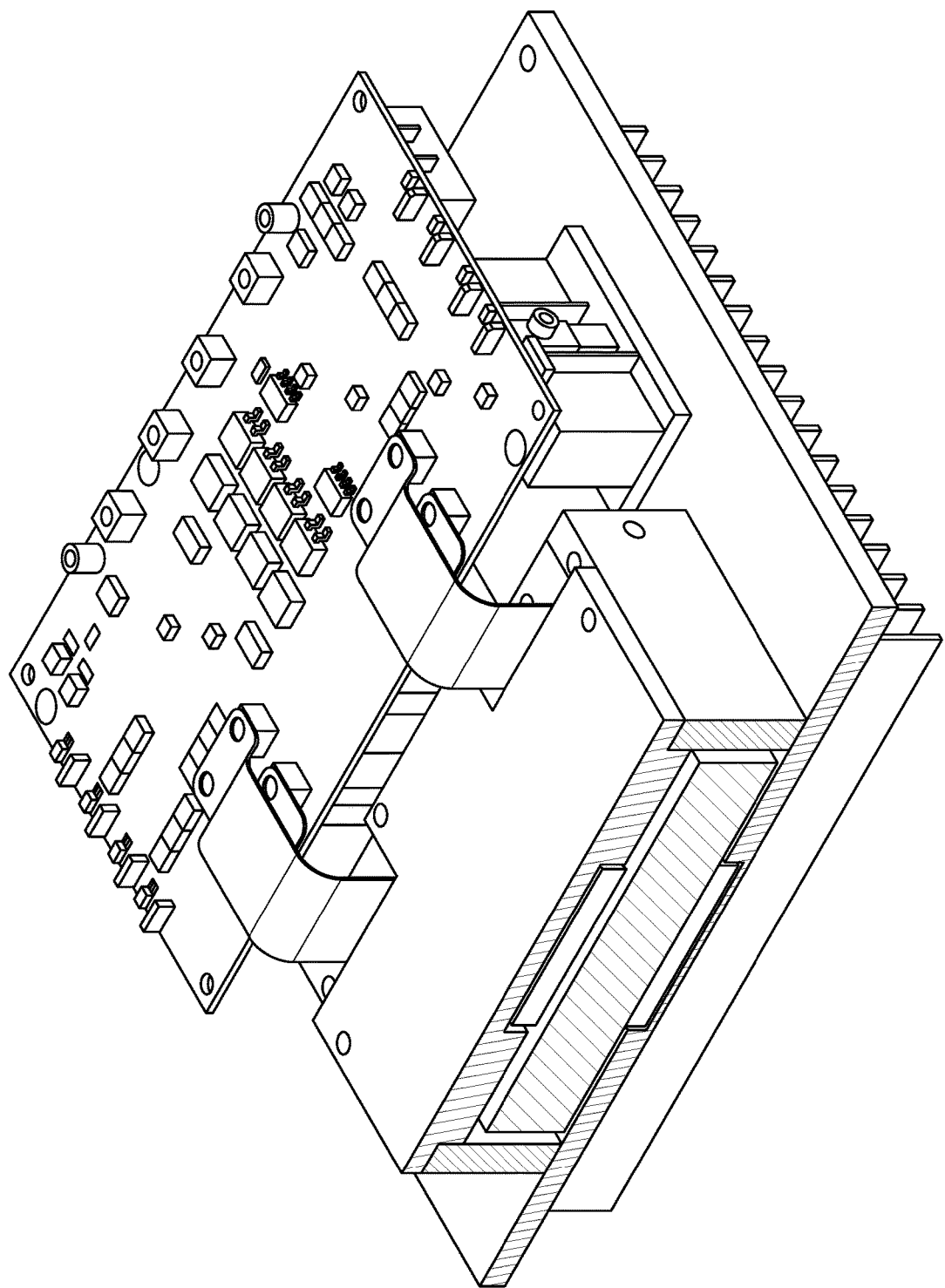

Further, the transformer assembly may include ceramic thermal shunts for conducting heat to the baseplate from the core center post (see FIGS. 6A-C). This embodiment of the disclosed bi-directional charger is depicted in FIG. 6C. The ceramic thermal shunts or shims 601a-x may face the center leg and be arranged above the heatsink 613a, b with the winding 609a-d surrounding the shunt. Side rails 607a b may be placed outside the winding and a metal cap 605 may be arranged above the shunt and winding (i.e., on the end of the shunt opposite the end of the shunt arranged proximate to the heatsink. Optionally, a thermally conductive core wrapping material 615, such as copper tape, may be placed between the heatsink and the shunt and between the shunt and the metal cap. The disclosed bi-directional charger may include one or more ceramic shunts depending on the heat conducting needs of the charger.

According to an embodiment of the present invention, the SiC devices or FETs/MOSFETs are arranged back-to-back such that the copper pads face away from each other. In one embodiment, three pairs of the devices are used. However, any suitable number of devices may be utilized. The devices are oriented in a perpendicular arrangement from the electronics board such that the devices are vertically mounted on the board. This arrangement results in an easier assembly process because the devices may be dropped straight into the board and soldered into place.

Figure 10:
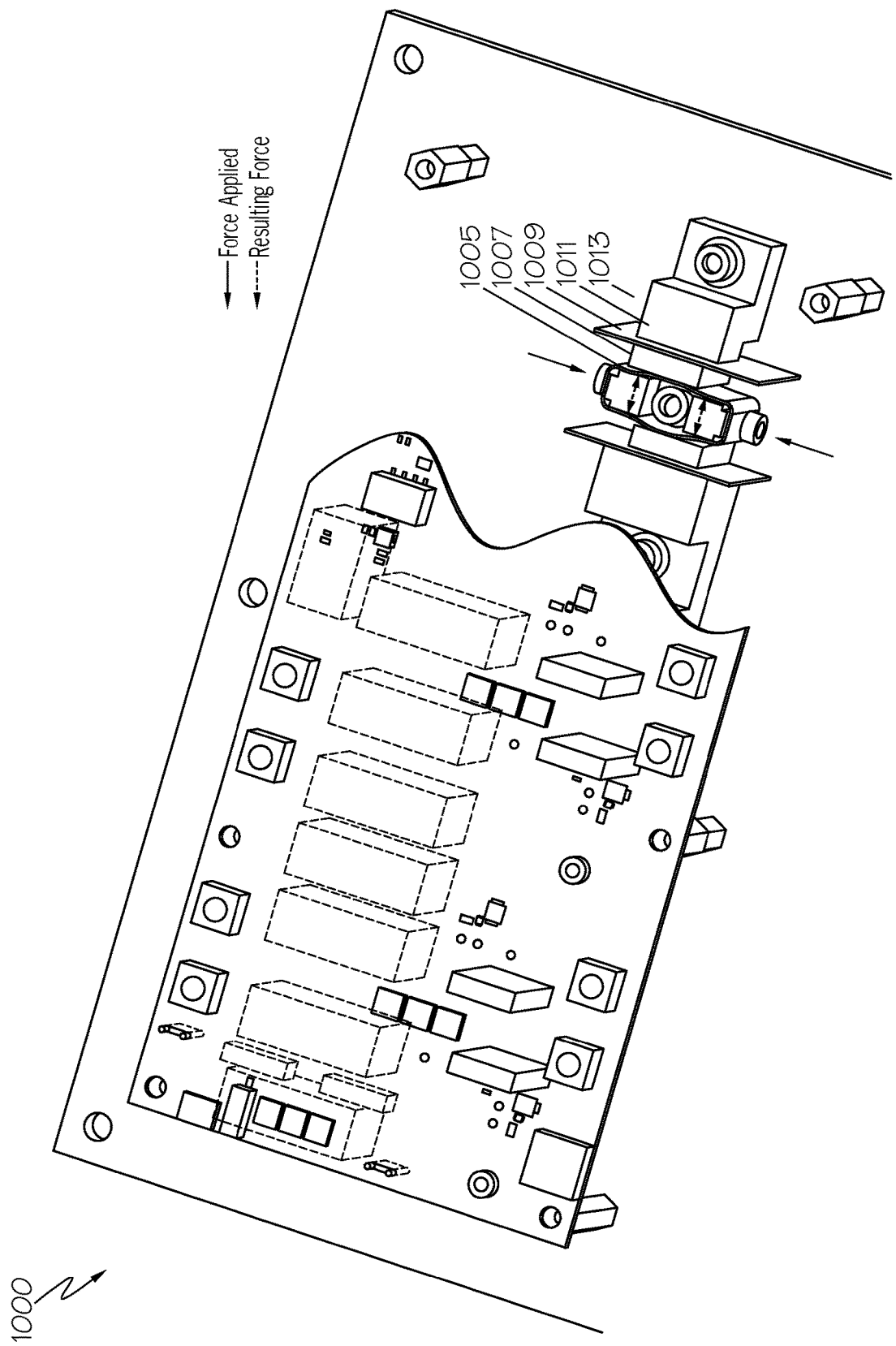
FIG. 10 is an arrangement of springs in the charger according to an embodiment of the present disclosure.

A wedge of some sort is provided to press the devices away from each other and into the vertically mounted element of the heat sink so they can be cooled. Rather than running a screw through, which is not a suitable solution because it would be conductive and ultimately ground to the case, the present invention utilizes a system of custom springs 1005 to sit in middle of the two packages (pair of devices/FETs 1007) as depicted in FIG. 10.

The custom springs may be compressed using a screw from outside. An insulated fiberglass paper, such as Nomex®, or other suitable insulating material, may be placed between the device and spring. In this arrangement, when the spring 1005 is tightened, the spring presses the devices against vertical blocks that are part of the heat sinks 1013 (heatsink block 1011).

An alumina (aluminum oxide) shim 1009 may be placed between the device and the heat sink 1013. The alumina shim 1009 may conduct heat from the device, through the alumina shim, to the heat sink block 1011, while still maintaining required electrical insulation. The alumina shim 1009 is an example and may be obtained from any suitable manufacturer. However, any suitable piece of material may be used to fill the gap or space between the devices and heat sink provided the material is nonconductive electrically but thermally conductive.

The above described method of mounting the devices to the heat sink allows efficient thermal mounting of the switching devices. The compressive springs described above, when compressed, are pressed into the heatsink blocks which are mated metal-to-metal in the heat sink. Force is applied to the springs, resulting in a force in a direction perpendicular to the direction of application of the force (as depicted in FIG. 10). Thus, the path of heat from device to heat sink fins is as follows: from the live back of the device, through the alumina shim, to the block bolted to the heat sink, the heat sink plate, down through the fin, and then over the fins. This ultimately results in more effective cooling of the power electronics components of the disclosed bi-directional charger.

Additional Capabilities of the Charger

The disclosed bi-directional charger may internally monitor temperature in the enclosure housing the power electronics components. The charger may observe temperature and upon detecting a rise or increase in temperature, the charger may de-rate the power. For example, the charger may receive a command to perform a full 15 kW charge/discharge. However, if the charger detects that the temperature is rising to excessive levels, the charger may curtail the power level back to a suitable level, such as 12.5 kW. If the temperature does not remain in a reasonable range after the power is curtailed, the charger may perform a thermal shut down. This ability to derate power before initiating a shutdown allows the disclosed charger to obtain more performance from the system before it might have to shut down, which in turn allows for supporting a higher range of operating temperatures.

The disclosed bi-directional charger may not immediately establish a charging connection when an electric vehicle is connected to the charger. When an electric vehicle is connected to the disclosed charger, the charger may require an identification code associated with the vehicle to be entered. This identification code may be manually entered into a user interface (such as described above) at the charger by a user of the electric vehicle after their electric vehicle is plugged into/connected to the charger.

The software also may provide the ability to identify the particular electric vehicle that the charger is connected to and then collect statistics and data for that particular electric vehicles, which may then be separated for long term analysis and support of battery warranty. Tracking or knowledge of battery temperature and other vehicle activities, such as those described above, may be independent of the charger (e.g., performed by the electric vehicle), in the charger, or some combination thereof (e.g., measured and communicated by the vehicle and logged and tracked by the charger). Further, through the network connection described above, the charger may communicate with the electric vehicle manufacturer to receive relevant information, such as battery temperature data regarding one or more electric vehicle batteries, to be used in long term analysis and support of battery warranty for the identified vehicle.

Alternately, the electric vehicle may have a radio-frequency identification (RFID) chip that is automatically detected by the cable gun of the charger when the charger is physically plugged into/connected to the electric vehicle. The identification code associates the particular electric vehicle with the charger and is reported to software stored on the cloud or other external server that can track metrics specific to the particular electric vehicle, such as vehicle performance and characteristics, battery state of charge, and battery temperature. The software may then analyze that data to maintain battery warranty when providing commands to the charger for charge/discharge operations with the particular electric vehicle connected to the charger.

What is claimed is:

1. A bi-directional charger comprising:
   a first portion configured to be coupled to an electrical grid;
   a second portion configured to be coupled to an electric vehicle;
   an enclosure comprising:
   a first power stage configured for AC-to-DC conversion and coupled to the first portion, the first power stage comprising a first processor;
   a second power stage configured for DC-to-DC conversion and coupled to the second portion, the second power stage comprising a second processor, wherein the second power stage is galvanically isolated and wherein the second power stage provides a nominal voltage to an isolation stage; and a third processor configured to:
  communicate with the first processor to control the first power stage; and
  communicate with the second processor to control the second power stage and manage communications with the electric vehicle.

2. The bi-directional charger of claim 1, wherein:
the first power stage is configured to regulate load voltage; and
the second power stage is configured to regulate a current to the electric vehicle.

3. The bi-directional charger of claim 1, wherein the second power stage is galvanically isolated with a transformer having a planar winding and a 1:1.4 voltage ratio.

4. The bi-directional charger of claim 1, wherein the second power stage is configured to operate as a buck-boost converter.

5. The bi-directional charger of claim 1, wherein the enclosure further comprises:
  a stirring fan configured to circulate air within the enclosure, wherein the enclosure is sealed.

6. The bi-directional charger of claim 1, wherein the enclosure further comprises:
  a sealed portion housing the first power stage, the second power stage, and the third processor; and
  at least one cooling tunnel comprising at least one fan to cool at least one heat sink thermally coupled to the first power stage and the second power stage.

7. The bi-directional charger of claim 1, wherein the isolation stage is combined with the second power stage.

8. The bi-directional charger of claim 1, wherein the isolation stage comprises a fourth processor, wherein the third processor is configured to communicate with the fourth processor to control the isolation stage.

9. A bi-directional charger comprising:
  a first portion configured to be coupled to an electrical grid;
  a second portion configured to be coupled to an electric vehicle;
  an enclosure comprising:
    a first power stage configured for AC-to-DC conversion and coupled to the first portion, the first power stage comprising a first processor;
    a second power stage configured for DC-to-DC conversion and coupled to the second portion, the second power stage comprising a second processor, wherein the second power stage is galvanically isolated; and
    a third processor configured to:
      communicate with the first processor to control the first power stage; and
      communicate with the second processor to control the second power stage and manage communications with the electric vehicle, and
    wherein the first power stage and second power stage are configured to operate based on a reactive power and an effective power, wherein the first power stage and second power stage are configured to perform:
      inductive discharge of a battery of the electric vehicle when the reactive power is positive and the effective power is positive;
      inductive charge of the battery of the electric vehicle when the reactive power is positive and effective power is negative;
      capacitive charge of the battery of the electric vehicle when the reactive power is negative and the effective power is negative; and
      capacitive discharge of the battery of the electric vehicle when the reactive power is negative and the effective power is positive.

10. The bi-directional charger of claim 9, wherein the second power stage is configured to provide a nominal voltage to the isolation stage.

11. The bi-directional charger of claim 9, wherein: the first power stage is configured to regulate load voltage; and the second power stage is configured to regulate a current to the electric vehicle.

12. The bi-directional charger of claim 9, wherein the second power stage is galvanically isolated with a transformer having a planar winding and a 1:1.4 voltage ratio.

13. The bi-directional charger of claim 9, wherein the second power stage is configured to operate as a buck-boost converter.

14. The bi-directional charger of claim 1, wherein the enclosure further comprises:
  a stirring fan configured to circulate air within the enclosure, wherein the enclosure is sealed.

15. The bi-directional charger of claim 1, wherein the enclosure further comprises:
  a sealed portion housing the first power stage, the second power stage, and the third processor; and
  at least one cooling tunnel comprising at least one fan to cool at least one heat sink thermally coupled to the first power stage and the second power stage.

16. The bi-directional charger of claim 9, wherein the isolation stage is combined with the second power stage.

17. The bi-directional charger of claim 9, wherein the isolation stage comprises a fourth processor, wherein the third processor is configured to communicate with the fourth processor to control the isolation stage.

* * * * *